(12) United States Patent
McCune

(10) Patent No.: US 7,395,038 B2
(45) Date of Patent: Jul. 1, 2008

(54) HIGH-EFFICIENCY MODULATING RF AMPLIFIER

(75) Inventor: Earl W. McCune, Santa Clara, CA (US)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 11/317,228

(22) Filed: Dec. 22, 2005

(65) Prior Publication Data

US 2006/0135096 A1   Jun. 22, 2006

Related U.S. Application Data

(63) Continuation of application No. 10/094,104, filed on Mar. 7, 2002, now Pat. No. 7,099,635, which is a continuation of application No. 09/247,095, filed on Feb. 9, 1999, now Pat. No. 6,377,784.

(51) Int. Cl.
*H01Q 11/12* (2006.01)
*H04B 1/04* (2006.01)

(52) U.S. Cl. ............... 455/127.1; 455/127.3; 455/127.5; 455/93; 455/102; 455/108; 455/110; 455/341; 330/10; 330/75; 330/127; 330/199; 375/297; 375/300

(58) Field of Classification Search ............... 375/297, 375/318, 300, 330; 330/10, 75, 127, 199, 330/200, 297, 207 R; 455/127.1, 127.2, 455/127.3, 127.4, 127.5, 93, 110, 102, 108, 455/120, 341
See application file for complete search history.

(56) References Cited

U.S. PATENT DOCUMENTS 5,126,688 A   6/1992   Nakanishi et al.

(Continued)

OTHER PUBLICATIONS

Frederick Raab et al. "High-Efficiency Multimode HF/ VHF Transmitter For Communication and Jamming" Green Mountain Radio Research Company, Vermont USA, 1994.

(Continued)

*Primary Examiner*—Matthew Anderson
*Assistant Examiner*—Shaima Q Aminzay
(74) *Attorney, Agent, or Firm*—McDermott Will & Emery LLP

(57) ABSTRACT

The present invention, generally speaking, provides for high-efficiency power control of a high-efficiency (e.g., hard-limiting or switch-mode) power amplifier in such a manner as to achieve a desired modulation. In one embodiment, the spread between a maximum frequency of the desired modulation and the operating frequency of a switch-mode DC-DC converter is reduced by following the switch-mode converter with an active linear regulator. The linear regulator is designed so as to control the operating voltage of the power amplifier with sufficient bandwidth to faithfully reproduce the desired amplitude modulation wave-form. The linear regulator is further designed to reject variations on its input voltage even while the output voltage is changed in response to an applied control signal. This rejection will occur even though the variations on the input voltage are of commensurate or even lower frequency than that of the controlled output variation. Amplitude modulation may be achieved by directly or effectively varying the operating voltage on the power amplifier while simultaneously achieving high efficiency in the conversion of primary DC power to the amplitude modulated output signal. High efficiency is enhanced by allowing the switch-mode DC-to-DC converter to also vary its output voltage such that the voltage drop across the linear regulator is kept at a low and relatively constant level. Time-division multiple access (TDMA) bursting capability may be combined with efficient amplitude modulation, with control of these functions being combined. In addition, the variation of average output power level in accordance with commands from a communications system may also be combined within the same structure.

16 Claims, 5 Drawing Sheets

U.S. PATENT DOCUMENTS

| | | | |
|---|---|---|---|
| 5,159,283 A * | 10/1992 | Jensen | 330/129 |
| 5,214,393 A | 5/1993 | Aihara | |
| 5,287,555 A | 2/1994 | Wilson et al. | |
| 5,313,658 A * | 5/1994 | Nakamura | 455/69 |
| 5,430,889 A | 7/1995 | Hulbert et al. | |
| 5,452,473 A * | 9/1995 | Weiland et al. | 455/88 |
| 5,506,546 A * | 4/1996 | Kowaguchi | 332/103 |
| 5,590,408 A * | 12/1996 | Weiland et al. | 455/69 |
| 5,959,499 A | 9/1999 | Khan et al. | |
| 5,999,829 A | 12/1999 | Chun et al. | |
| 6,002,923 A | 12/1999 | Sahlman | |
| 6,097,251 A * | 8/2000 | Khullar et al. | 330/129 |
| 6,101,224 A * | 8/2000 | Lindoff et al. | 375/300 |
| 6,130,910 A * | 10/2000 | Anderson et al. | 375/238 |
| 6,327,462 B1 | 12/2001 | Loke et al. | |
| 6,370,364 B1 | 4/2002 | Liimatainen | |
| 6,449,466 B1 | 9/2002 | Jin et al. | |
| 6,466,772 B1 * | 10/2002 | Rozenblit et al. | 455/126 |
| 6,636,112 B1 | 10/2003 | McCune | |
| 6,816,016 B2 | 11/2004 | Sander et al. | |
| 6,819,941 B2 | 11/2004 | Dening et al. | |
| 6,864,669 B1 | 3/2005 | McCune et al. | |

OTHER PUBLICATIONS

G. D. Funk et al. "A Linearized 1 GHz Class E Amplifier" Calgary, Alberta Canada, 1997.

David Su et al. "3.6 An IC for Linearizing RF Power Amplifiers using Envelope Elimination and Restoration" Hewlett-Packard Laboratories, Palo Alto, CA, not available.

* cited by examiner

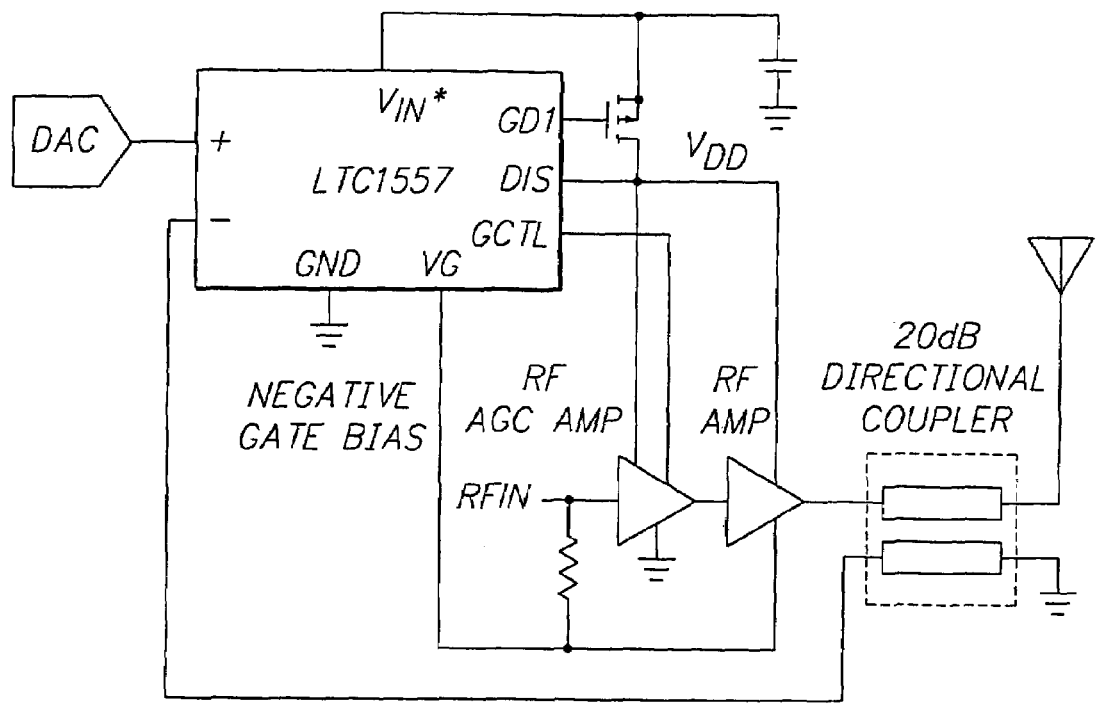
FIG. 1 *(PRIOR ART)*
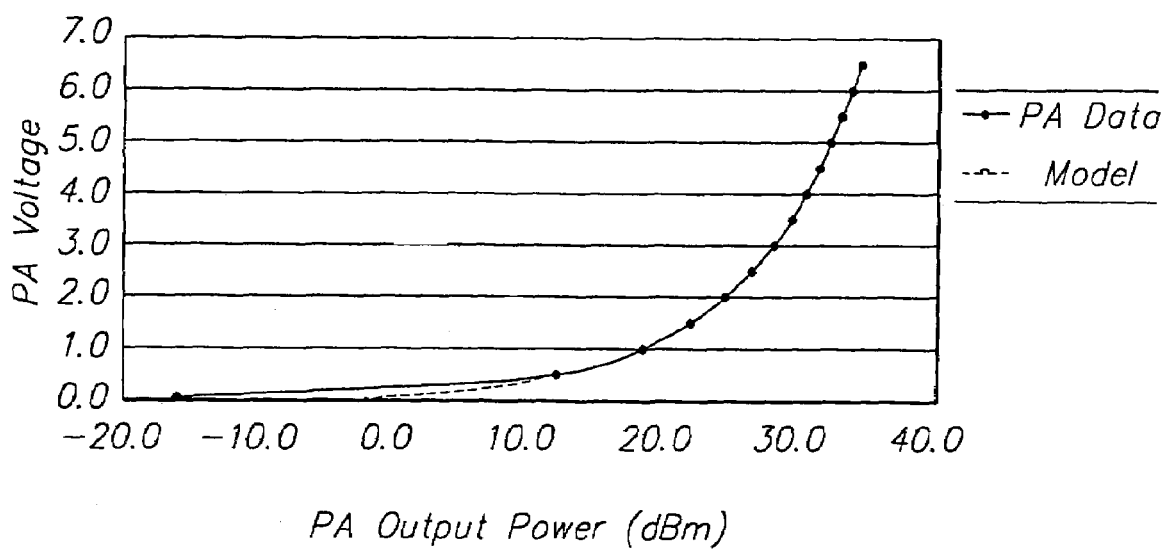
FIG. 4

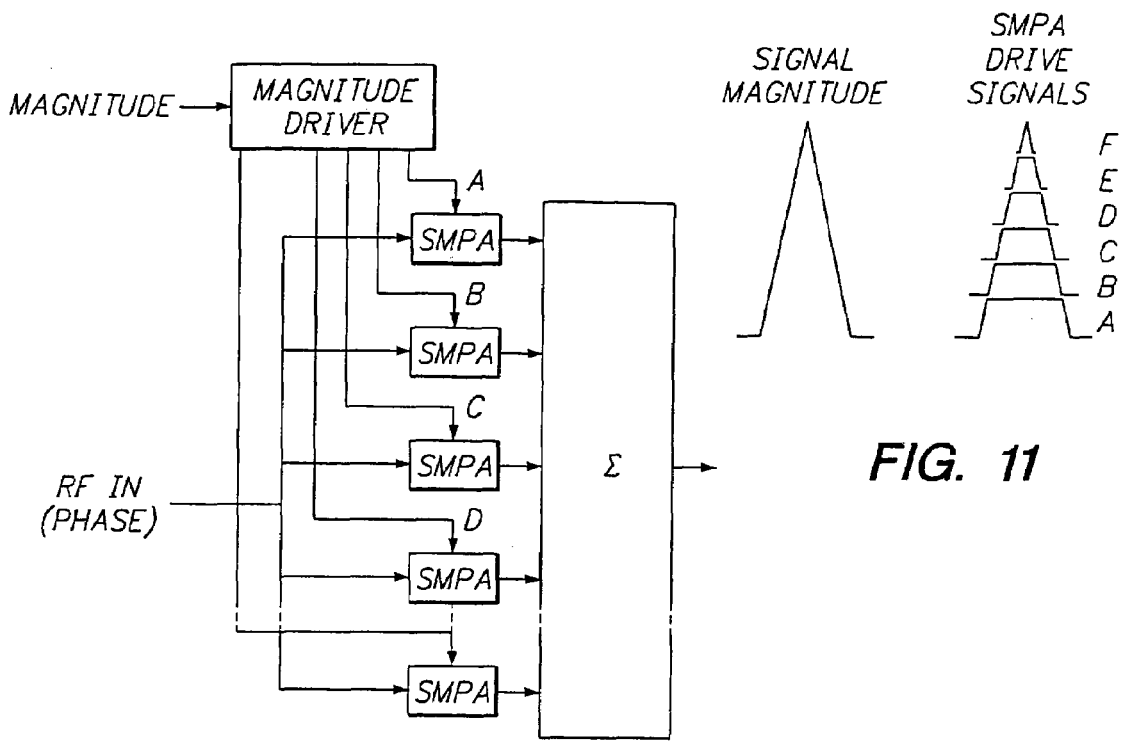
FIG. 10
FIG. 11
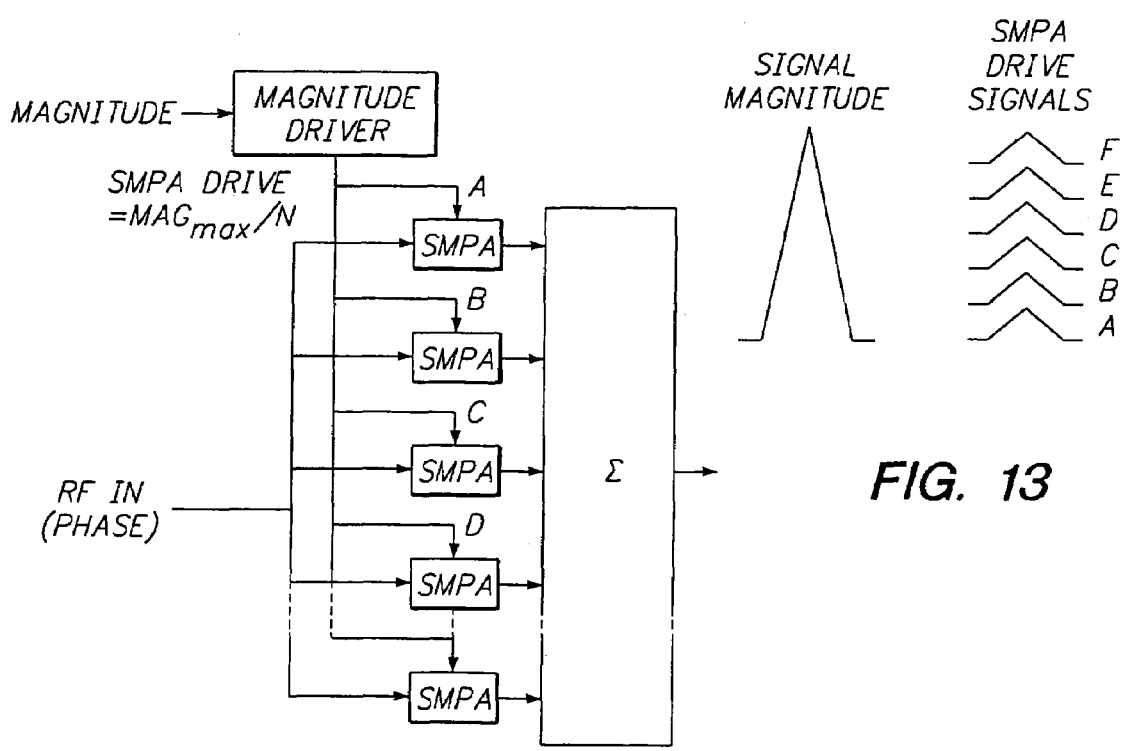
FIG. 12
FIG. 13

HIGH-EFFICIENCY MODULATING RF AMPLIFIER

CROSS-REFERENCE TO RELATED APPLICATIONS

This is a continuation application of application Ser. No. 10/094,104 filed on Mar. 7, 2002 now U.S. Pat. No. 7,099,635 which is a continuation of application Ser. No. 09/247,095 filed on Feb. 09, 1999 and issued as U.S. Pat. No. 6,377,784 on Apr. 23, 2003.

BACKGROUND OF THE INVENTION

1. Field of the Invention

The present invention relates to RF amplifiers and signal modulation.

2. State of the Art

Battery life is a significant concern in wireless communications devices such as cellular telephones, pagers, wireless modems, etc. Radio-frequency transmission, especially, consumes considerable power. A contributing factor to such power consumption is inefficient power amplifier operation. A typical RF power amplifier for wireless communications operates with only about 10% efficiency. Clearly, a low-cost technique for significantly boosting amplifier efficiency would satisfy an acute need.

Furthermore, most modern digital wireless communications devices operate on a packet basis. That is, the transmitted information is sent in a series of one or more short bursts, where the transmitter is active only during the burst times and inactive at all other times. It is therefore also desirable that control of burst activation and deactivation be controlled in an energy-efficient manner, further contributing to extended battery life.

Power amplifiers are classified into different groups: Class A, Class B, Class AB, etc. The different classes of power amplifiers usually signify different biasing conditions. In designing an RF power amplifier, there is usually a trade-off between linearity and efficiency. The different classes of amplifier operation offer designers ways to balance these two parameters.

Generally speaking, power amplifiers are divided into two different categories, linear and non-linear. Linear amplifiers (e.g. Class A amplifiers and Class B push-pull amplifiers), maintain high linearity, resulting in faithful reproduction of the input signal at their output since the output signal is linearly proportional to the input signal. In non-linear amplifiers (e.g. single-ended Class B and Class C amplifiers), the output signal is not directly proportional to the input signal. The resulting amplitude distortion on the output signal makes these amplifiers most applicable to signals without any amplitude modulation, which are also known as constant-envelope signals.

Amplifier output efficiency is defined as the ratio between the RF output power and the input (DC) power. A major source of power amplifier inefficiency is power dissipated in the transistor. A Class A amplifier is inefficient since current flows continuously through the device. Conventionally, efficiency is improved by trading-off linearity for increased efficiency. In Class B amplifiers, for example, biasing conditions are chosen such that the output signal is cut off during half of the cycle unless the opposing half is provided by a second transistor (push-pull). As a result, the waveform will be less linear. The output waveform may still be made sinusoidal using a tank circuit or other filter to filter out higher and lower frequency components.

Class C amplifiers conduct during less than 50% of the cycle, in order to further increase efficiency; i.e., if the output current conduction angle is less than 180 degrees, the amplifier is referred to as Class C. This mode of operation can have a greater efficiency than Class A or Class B, but it typically creates more distortion than Class A or Class B amplifiers. In the case of a Class C amplifier, there is still some change in output amplitude when the input amplitude is varied. This is because the Class C amplifier operates as a constant current source—albeit one that is only on briefly—and not a switch.

The remaining classes of amplifiers vigorously attack the problem of power dissipation within the transistor, using the transistor merely as a switch. The underlying principle of such amplifiers is that a switch ideally dissipates no power, for there is either zero voltage across it or zero current through it. Since the switch's V-I product is therefore always zero, there is no dissipation in this device. A Class E power amplifier uses a single transistor, in contrast with a Class D power amplifier, which uses two transistors In real life, however, switches are not ideal. (Switches have turn on/off time and on-resistance.) The associated dissipation degrades efficiency. The prior art has therefore sought for ways to modify so-called "switch-mode" amplifiers (in which the transistor is driven to act as a switch at the operating frequency to minimize the power dissipated while the transistor is conducting current) so that the switch voltage is zero for a non-zero interval of time about the instant of switching, thereby decreasing power dissipation. The Class E amplifier uses a reactive output network that provides enough degrees of freedom to shape the switch voltage to have both zero value and zero slope at switch turn-on, thus reducing switching losses. Class F amplifiers are still a further class of switch-mode amplifiers. Class F amplifiers generate a more square output waveform as compared to the usual sinewave. This "squaring-up" of the output waveform is achieved by encouraging the generation of odd-order harmonics (i.e., x3, x5, x7, etc.) and suppressing the even-order harmonics (i.e., x2, x4, etc.) in the output network.

An example of a known power amplifier for use in a cellular telephone is shown in FIG. 1. GSM cellular telephones, for example, must be capable of programming output power over a 30 dBm range. In addition, the transmitter turn-on and turn-off profiles must be accurately controlled to prevent spurious emissions. Power is controlled directly by the DSP (digital signal processor) of the cellular telephone, via a DAC (digital to analog converter). In the circuit of FIG. 1, a signal GCTL drives the gate of an external AGC amplifier that controls the RF level to the power amplifier. A portion of the output is fed back, via a directional coupler, for closed-loop operation. The amplifier in FIG. 1 is not a switch-mode amplifier. Rather, the amplifier is at best a Class AB amplifier driven into saturation, and hence demonstrates relatively poor efficiency.

Survey of Prior Patents

Control of the output power from an amplifier is consistently shown as requiring a feedback structure, as exemplified in U.S. Pat. Nos. 4,392,245; 4,992,753; 5,095,542; 5,193,223; 5,369,789; 5,410,272; 5,697,072 and 5,697,074. Other references, such as U.S. Pat. No. 5,276,912, teach the control of amplifier output power by changing the amplifier load circuit.

A related problem is the generation of modulated signals, e.g., amplitude modulated (AM) signals, quadrature amplitude modulated signals (QAM), etc. A known IQ modulation structure is shown in FIG. 2. A data signal is applied to a quadrature modulation encoder that produces I and Q signals.

The I and Q signals are applied to a quadrature modulator along with a carrier signal. The carrier signal is generated by a carrier generation block to which a tuning signal is applied.

Typically, an output signal of the quadrature modulator is then applied to a variable attenuator controlled in accordance with a power control signal. In other instances, power control is implemented by vaying the gain of the amplifier. This is achieved by adjusting the bias on transistors within the inear amplifier, taking advantage of the effect where transistor transconductance varies with the aplied bias conditions. Since amplifier gain is strongly related to the transistor transconductance, varying the transconductance effectively varies the amplifier gain. A resulting signal is then amplified by a linear power amplifier and applied to an antenna.

A method for producing accurate amplitude modulated signals using nonlinear Class C amplifiers, called "plate modulation," has been known for over 70 years as described in texts such as Terman's Radio Engineers Handbook (McGraw-Hill, 1943). In the typical plate-modulation technique, output current from the modulator amplifier is linearly added to the power supply current to the amplifying element (vacuum tube or transistor), such that the power supply current is increased and decreased from its average value in accordance with the amplitude modulation. This varying current causes the apparent power supply voltage on the amplifying element to vary, in accordance with the resistance (or conductance) characteristics of the amplifying element.

By using this direct control of output power, AM can be effected as long as the bandwidth of the varying operating voltage is sufficient. That is, these nonlinear amplifiers actually act as linear amplifiers with respect to the amplifier operating voltage. To the extent that this operating voltage can be varied with time while driving the nonlinear power amplifier, the output signal will be linearly amplitude modulated.

In AM signals, the amplitude of the signal is made substantially proportional to the magnitude of an information signal, such as voice. Information signals such as voice are not constant in nature, and so the resulting AM signals are continuously varying in output power. Methods of achieving amplitude modulation include the combination of a multitude of constant amplitude signals, as shown in U.S. Pat. Nos. 4,580,111; 4,804,931; 5,268,658 and 5,652,546. Amplitude modulation by using pulse-width modulation to vary the power supply of the power amplifier is shown in U.S. Pat. Nos. 4,896,372; 3,506,920; 3,588,744 and 3,413,570. However, the foregoing patents teach that the operating frequency of the switch-mode DC-DC converter must be significantly higher than the maximum modulation frequency.

U.S. Pat. No. 5,126,688 to Nakanishi et al. addresses the control of linear amplifiers using feedback control to set the actual amplifier output power, combined with periodic adjustment of the power amplifier operating voltage to improve the operating efficiency of the power amplifier. The primary drawback of this technique is the requirement for an additional control circuit to sense the desired output power, to decide whether (or not) the power amplifier operating voltage should be changed to improve efficiency, and to effect any change if so decided. This additional control circuitry increases amplifier complexity and draws additional power beyond that of the amplifier itself, which directly reduces overall efficiency.

A further challenge has been to generate a high-power RF signal having desired modulation characteristics. This object is achieved in accordance with the teachings of U.S. Pat. No. 4,580,111 to Swanson by using a multitude of high efficiency amplifiers providing a fixed output power, which are enabled in sequence such that the desired total combined output power is a multiple of this fixed individual amplifier power. In this scheme, the smallest change in overall output power is essentially equal to the power of each of the multitude of high efficiency amplifiers. If finely graded output power resolution is required, then potentially a very large number of individual high efficiency amplifiers may be required. This clearly increases the overall complexity of the amplifier.

U.S. Pat. No. 5,321,799 performs polar modulation, but is restricted to full-response data signals and is not useful with high power, high-efficiency amplifiers. The patent teaches that amplitude variations on the modulated signal are applied through a digital multiplier following phase modulation and signal generation stages. The final analog signal is then developed using a digital-to-analog converter. As stated in the State of the Art section herein, signals with information already implemented in amplitude variations are not compatible with high-efficiency, nonlinear power amplifiers due to the possibly severe distortion of the signal amplitude variations.

Despite the teachings of the foregoing references, a number of problems remain to be solved, including the following: to achieve high-efficiency amplitude modulation of an RF signal by varation of the operating voltage using a switch mode converter without requiring high-frequency switch-mode operation (as compared to the modulation frequency); to unify power-level and burst control with modulation control; to enable high-efficiency modulation of any desired character (amplitude and/or phase); and to enable high-power operation (e.g., for base stations) without sacrificing power efficiency.

SUMMARY OF THE INVENTION

The present invention, generally speaking, provides for high-efficiency power control of a high-efficiency (e.g., hard-limiting or switch-mode) power amplifier in such a manner as to achieve a desired modulation. In one embodiment, the spread between a maximum frequency of the desired modulation and the operating frequency of a switch-mode DC-DC converter is reduced by following the switch-mode converter with an active linear regulator. The linear regulator is designed so as to control the operating voltage of the power amplifier with sufficient bandwidth to faithfully reproduce the desired amplitude modulation wave-form. The linear regulator is further designed to reject variations on its input voltage even while the output voltage is changed in response to an applied control signal. This rejection will occur even though the variations on the input voltage are of commensurate or even lower frequency than that of the controlled output variation. Amplitude modulation may be achieved by directly or effectively varying the operating voltage on the power amplifier while simultaneously achieving high efficiency in the conversion of primary DC power to the amplitude modulated output signal. High efficiency is enhanced by allowing the switch-mode DC-to-DC converter to also vary its output voltage such that the voltage drop across the linear regulator is kept at a low and relatively constant level. Time-division multiple access (TDMA) bursting capability may be combined with efficient amplitude modulation, with control of these functions being combined. In addition, the variation of average output power level in accordance with commands from a communications system may also be combined within the same structure.

The high-efficiency amplitude modulation structure may be extended to any arbitrary modulation. Modulation is performed in polar form, i.e., in a quadrature-free manner.

Single high-efficiency stages may be combined together to form high-power, high-efficiency modulation structures.

BRIEF DESCRIPTION OF THE DRAWING

The present invention may be further understood from the following description in conjunction with the appended drawing. In the drawing:

FIG. 1 is a block diagram of a known power amplifier with output power controlled by varying the power supply voltage;

FIG. 4 is a plot comparing saturated Class AB power amplifier output power versus operating voltage with the mathematical model $V=\sqrt{PR}$;

FIG. 10 is a block diagram of a first high power, high efficiency, amplitude modulating RF amplifier;

FIG. 11 is a waveform diagram illustrating operation of the amplifier of FIG. 10;

FIG. 12 is a block diagram of a second high power, high efficiency, amplitude modulating RF amplifier; and FIG. 13 is a waveform diagram illustrating operation of the amplifier of FIG. 12.

DETAILED DESCRIPTION OF THE PREFERRED EMBODIMENTS

Figure 2:
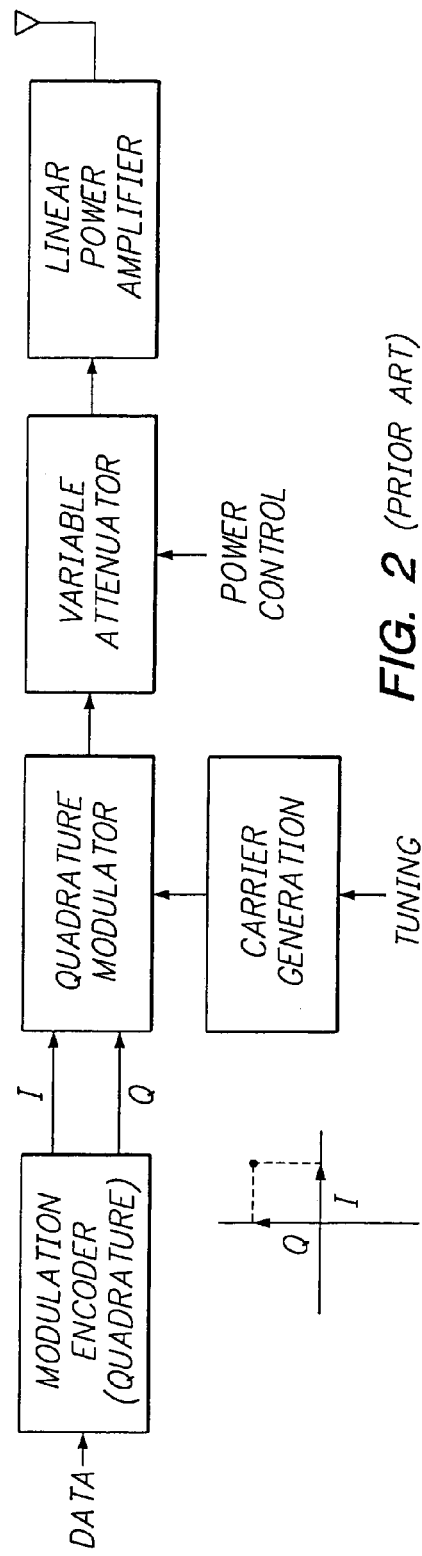
FIG. 2 is a block diagram of a known IQ modulation structure.
Figure 3:
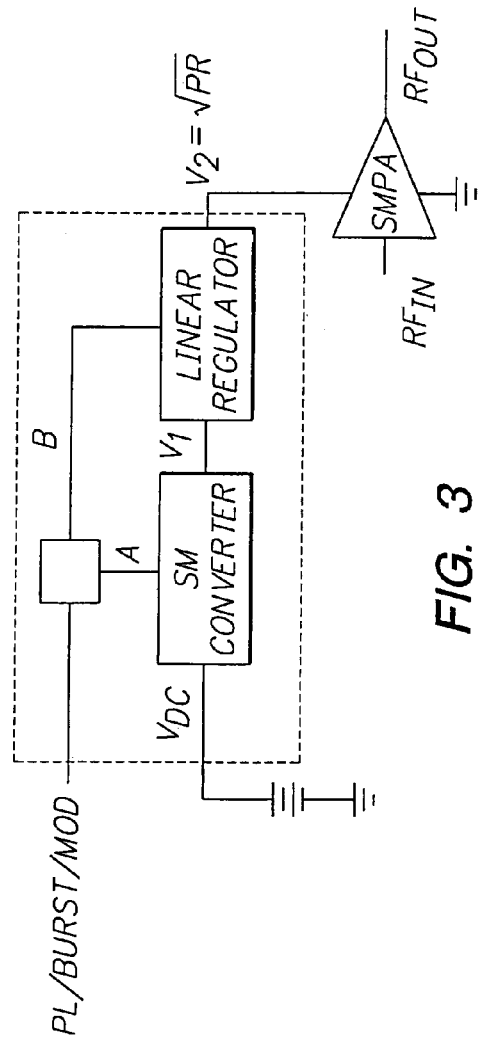
FIG. 3 is a block diagram of a power amplifier in accordance with an exemplary embodiment of the present invention.

Referring now to FIG. 3, a block diagram is shown of a power amplifier that may be used in the present invention. A switch-mode (or saturated) nonlinear amplifier has applied to it a voltage produced by a power control stage. In an exemplary embodiment, the voltage V applied to the nonlinear amplifier is controlled substantially in accordance with the equation $$V=\sqrt{PR}$$

where P is the desired power output level of the amplifier and R is the resistance of the amplifier. In the case of a switch-mode or saturated amplifier, the resistance R may be regarded as constant. The power control stage receives a DC input voltage, e.g., from a battery, and receives a power level control signal and outputs a voltage in accordance with the foregoing equation.

The efficacy of directly controlling output power of non-linear amplifiers over a wide dynamic range by solely varying the operating voltage is demonstrated by FIG. 4, showing a plot comparing saturated Class AB power amplifier output power versus operating voltage with the mathematical model $V=\sqrt{PR}$.

Referring again to FIG. 3, a power control circuit in accordance with an exemplary embodiment of the invention is shown. A power control stage includes a switch-mode converter stage and a linear regulator stage connected in series. The switch-mode converter may be a Class D device, for example, or a switch-mode power supply (SMPS). The switch-mode converter efficiently steps down the DC voltage to a voltage that somewhat exceeds but that approximates the desired power-amplifier operating voltage level. That is, the switch-mode converter performs an efficient gross power level control. The switch-mode converter may or may not provide sufficiently fine control to define ramp portions of a desired power envelope.

The linear regulator performs a filtering function on the output of the switch-mode converter. That is, the linear regulator controls precise power-envelope modulation during a TDMA burst, for example. The linear regulator may or may not provide level control capabilities like those of the switch-mode converter.

Note that, depending on the speed of the switch-mode converter and the linear regulator, the power control stage may be used to perform power control and/or amplitude modulation. A control signal PL/BURST is input to a control block, which outputs appropriate analog or digital control signals for the switch-mode converter and the linear regulator. The control block may be realized as a ROM (read-only memory) and/or a DAC (digital to analog converter).

Figure 5:
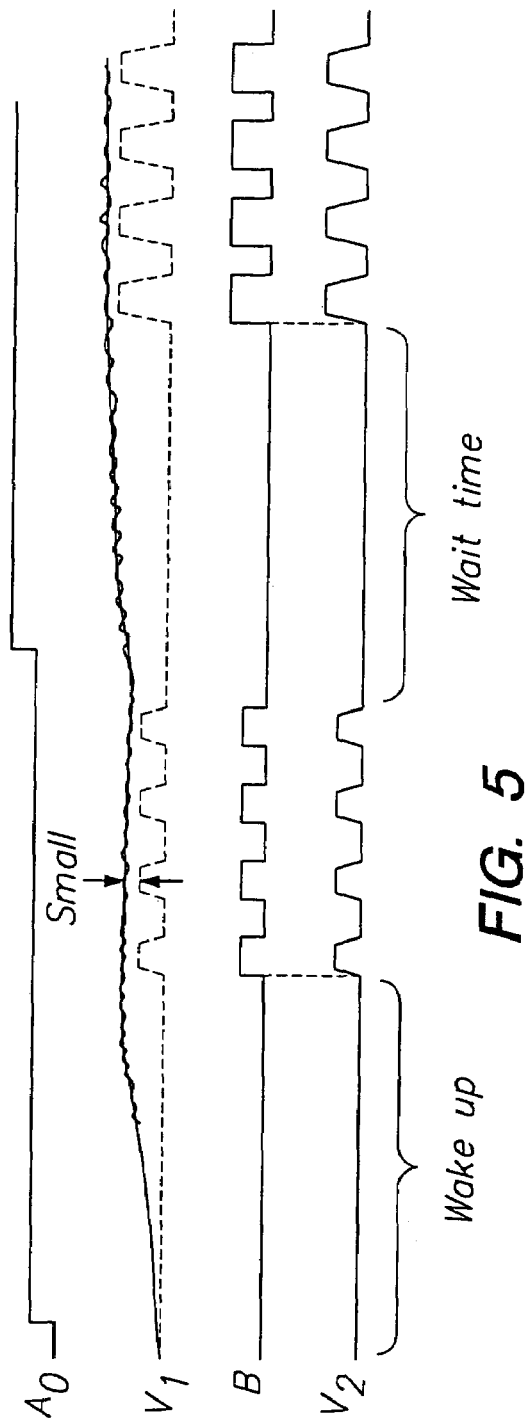
FIG. 5 is a waveform diagram illustrating operation of one embodiment of the invention.

Referring to FIG. 5, a waveform diagram is shown, illustrating operation of one embodiment of the invention. The waveforms A and B represent analog control signals applied to the switch-mode converter and to the linear regulator, respectively. The waveforms $V_1$ and $V_2$ represent the output voltages of the switch-mode converter and to the linear regulator, respectively. Assume that the switch-mode converter has a relatively large time constant, i.e., that it ramps relatively slowly. When the control signal A is set to a first non-zero power level, the voltage $V_1$ will then begin to ramp toward a commensurate voltage. Because of the switch-mode nature of the converter, the voltage $V_1$ may have a considerable amount of ripple. An amount of time required to reach that voltage defines the wakeup period. When that voltage is reached, the control signal B is raised and lowered to define a series of transmission bursts. When the control signal B is raised, the voltage $V_2$ ramps quickly up to a commensurate voltage, and when the control signal B is lowered, the voltage $V_2$ ramps quickly down. Following a series of bursts (in this example), the control signal A is raised in order to increase the RF power level of subsequent bursts. The control signal B remains low during a wait time. When the voltage $V_1$ has reached the specified level, the control signal B is then raised and lowered to define a further series of transmission bursts.

The voltage $V_2$ is shown in dotted lines superimposed on the voltage $V_1$. Note that the voltage $V_2$ is less than the voltage $V_1$ by a small amount, greater than the negative peak ripple on the voltage $V_1$. This small difference between the input voltage of the linear regulator $V_1$ and the output voltage of the linear regulator $V_2$ makes overall high-efficiency operation possible.

Figure 6:
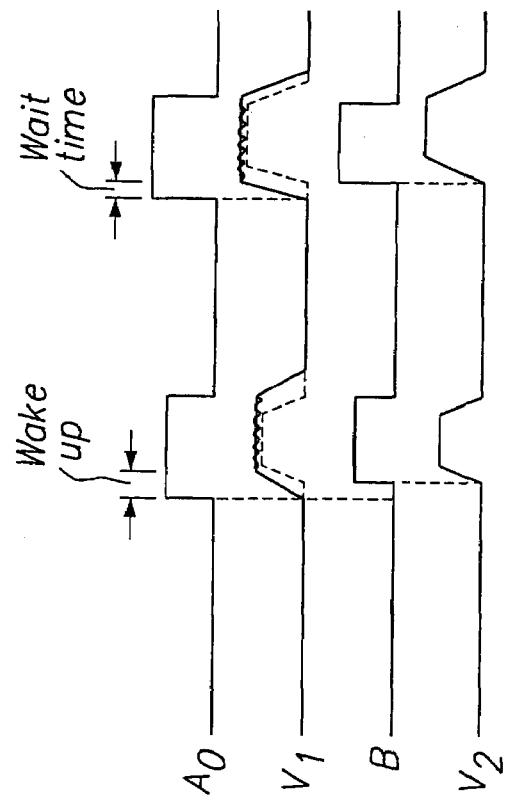
FIG. 6 is a waveform diagram illustrating operation of another embodiment of the invention.

Referring to FIG. 6, in accordance with a different embodiment of the invention, the switch-mode converter is assumed to have a relatively short time constant; i.e., it ramps relatively quickly. Hence, when the control signal A is raised, the voltage $V_1$ ramps quickly to the commensurate voltage. The control signal B is then raised, and the voltage $V_2$ is ramped. The time difference between when the control signal A is raised on the control signal B is raised defines the wake up time, which may be very short, maximizing sleep time and power savings. The control signal B is then lowered at the conclusion of the transmission burst, after which the control signal A is lowered. Following the example of FIG. 5, in FIG. 6, when the control signal A is next raised, it defines a higher power level. Again, the voltage $V_2$ is superimposed in dotted lines on the voltage $V_1$.

Figure 7:
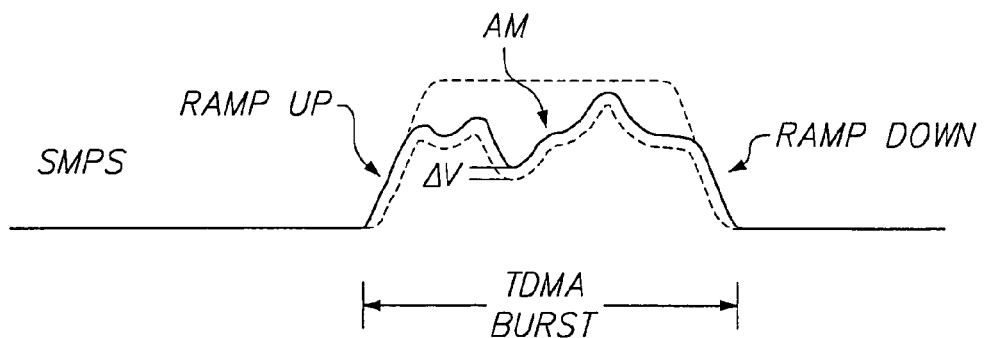
FIG. 7 is a waveform diagram illustrating bursted AM operation.

The same structure may be used to perform amplitude modulation in addition to power and burst control. Referring to FIG. 7, a waveform diagram is shown illustrating bursted AM operation. An output signal of the switch-mode converted is shown as a solid line. As a burst begins, the output signal of the switch-mode converter ramps up. Optionally, as shown in dashed line, the switch-mode converter may ramp up to a fixed level with the linear regulator effecting all of the amplitude modulation on the output signal. More preferably, from an. efficiency standpoint, the switch-mode converter effects amplitude modulation, producing an output signal that, ignoring noise, is a small fixed offset $\Delta V$ above the desired output signal. The linear regulator removes the noise from the output signal of the switch-mode converter, effectively knocking down the signal by the amount $\Delta V$. The output signal of the linear regulator is shown as a dotted line in FIG. 7. At the conclusion of the burst, the signals ramp down.

Figure 8:
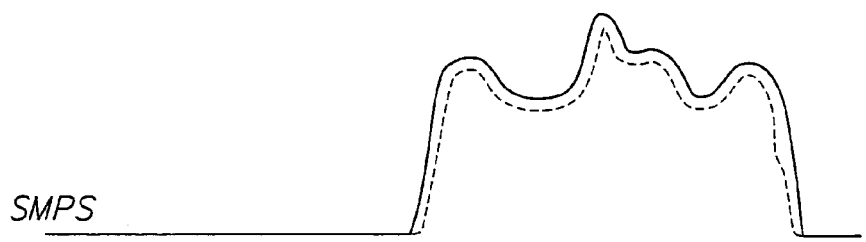
FIG. 8 is a waveform diagram illustrating bursted AM operation with power level control.

Full control of the output signal power level (average power of the signal) is retained. A succeeding burst, for example, might occur at a higher power level, as shown in FIG. 8. As compared to FIG. 7, in FIG. 8, all signals scale appropriately to realized a higher average power output.

Figure 9:
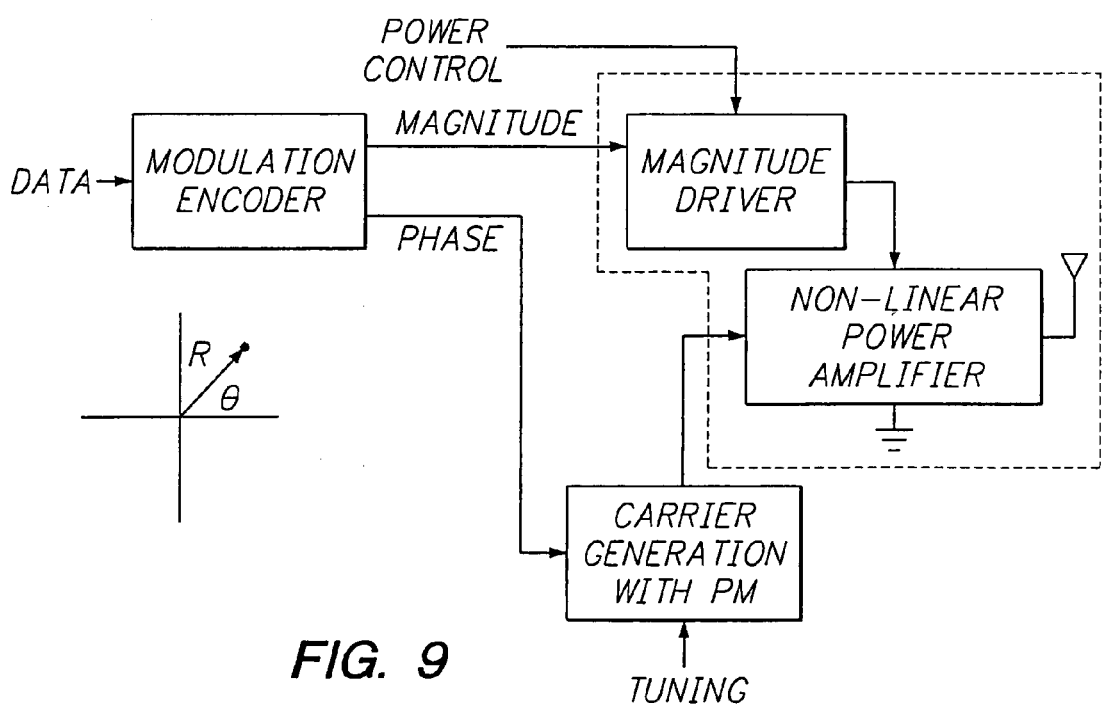
FIG. 9 is a block diagram of a polar modulation structure using a high-efficiency amplifier.

Incorporation of amplitude modulation on a phase-modulated signal, though it complicates the signal generation method, is often desirable since such signals may, and often do, occupy less bandwidth than purely phase-modulated signals. Referring to FIG. 9, a block diagram is shown of a polar modulation structure using a high-efficiency amplifier of the type described thus far. This polar modulation structure is capable of effecting any desired modulation. A data signal is applied to a modulation encoder that produces magitude and phase signals. The phase signal is applied to a phase-modulation-capable carrier generation block, to which a tuning signal is also applied. A resulting signal is the amplified by a nonlinear power amplifier of the type previously described. Meanwhile, the magnitude signal is applied to a magnitude driver. The magnitude driver also receives a power control signal. In response, the magnitude driver produces an operating voltage that is applied to the non-linear amplifier. The magnitude driver and the non-linear amplifier may be realized in the same manner as FIG. 3, described previously, as indicated in FIG. 9 by a dashed line.

The modulation structures described thus far are suitable for use in, among other applications, cellular telephone handsets. A similar need for high-efficiency RF signal generation exists in cellular telephone basestations. Basestations, however, operate at much higher power than handsets. The following structure may be used to achieve high-power, high-efficiency RF signal generation.

Referring to FIG. 10, a first high power, high efficiency, amplitude modulating RF amplifier includes multiple switch mode power amplifier (SMPA) blocks, each block being realized as shown in FIG. 3, for example. An RF signal to be amplified is input to all of the SMPA blocks in common. Separate control signals for each of the SMPA blocks are generated by a magnitude driver in response to a magnitude input signal. Output signals of the SMPA blocks are summed to form a single resultant output signal.

The manner of operation of the amplifier of FIG. 10 may be understood with reference to FIG. 11. On the left-hand side is shown an overall magnitude signal that is applied to the magnitude driver. On the right-hand side are shown SMPA drive signals output by the magnitude driver to be applied to the respective SMPAs. Note that the sum of the individual drive signals yields the overall magnitude signal.

An alternative embodiment of a high-power amplifier is shown in FIG. 12. In this embodiment, instead of generating individual drive signals for the respective SMPAs, a common drive signal is generated and applied in common to all of the SMPAs. At a given instant in time, the common drive signal is caused to have a value that is one Nth of an overall magnitude signal applied to the magnitude driver, where N is the number of SMPAs. The result is illustrated in FIG. 13. Once again, note that the sum of the individual drive signals yields the overall magnitude signal.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed:

1. An amplifier apparatus for use in a polar modulation structure, said amplifier apparatus comprising:
    a power control circuit for directly receiving a magnitude signal, a power supply signal and a control signal defining at least a power level and burst information, and producing a drive signal in accordance with the control signal; and
    an amplifier for receiving an RF input signal and the drive signal, and amplifying the RF input signal using the drive signal to produce an RF output signal.

2. The amplifier apparatus according to claim 1, wherein said amplifier is a non-liner amplifier or a switch-mode non-linear amplifier.

3. An amplifier apparatus for use in a polar modulation structure according to claim 1, wherein said control signal is provided to said power control circuit without utilizing any feedback of said RF output signal.

4. An amplifier apparatus for use in a polar modulation structure according to claim 1, wherein said power control circuit provides for adjustment of the output level of said RF output signal without utilizing any feedback of said RF output signal.

5. A wireless communications device comprising an amplifier apparatus for use in a polar modulation structure, said amplifier apparatus comprising:
    a power control circuit operable to produce a drive signal using a magnitude signal, a power supply signal, and a control signal defining at least a power level and burst information; and
    an amplifier for receiving an RF input signal and the drive signal produced by said power control circuit, said amplifier operable to amplify the RF input signal using the drive signal to produce an RF output signal.

6. The wireless communications device according to claim 5, wherein said amplifier is a non-linear amplifier or a switch-mode non-linear amplifier.

7. An amplifier apparatus for use in a polar modulation structure according to claim 1, wherein said power control circuit comprises a first converter for performing gross adjustment of the signal level of said power supply signal; and a second converter for receiving an output signal from said first converter and for performing fine adjustment of said signal level of said output signal of said first converter.

8. An amplifier apparatus for use in a polar modulation structure according to claim 7, wherein said first converter comprises a switch-mode converter, and said second converter comprises a linear regulator.

9. An amplifier apparatus for use in a polar modulation structure, said amplifier apparatus comprising:
- a power control circuit for directly receiving a magnitude signal, a power supply signal and a control signal defining at least a power level, and producing a drive signal in accordance with the control signal; and
- an amplifier for receiving an RF input signal and said drive signal, and amplifying said RF input signal using said drive signal to produce an RF output signal,
- wherein said power control circuit includes a first converter for performing gross adjustment of a signal level of said power supply signal; and a second converter for receiving an output signal from said first converter and for performing fine adjustment of a signal level of said output signal of said first converter.

10. The amplifier apparatus according to claim 9, wherein said amplifier is a non-linear amplifier or a switch-mode non-linear amplifier.

11. The amplifier apparatus for use in a polar modulation structure according to claim 9, wherein said first converter includes a switch-mode converter, and said second converter includes a linear regulator.

12. The amplifier apparatus for use in a polar modulation structure according to claim 9, wherein said power control circuit provides for adjustment of said output level of said RF output signal without utilizing any feedback of an RF output signal.

13. A wireless communications device comprising an amplifier apparatus for use in a polar modulation structure, said amplifier apparatus comprising:
- a power control circuit operable to produce a drive signal using a magnitude signal, a power supply signal, and a control signal defining at least a power level; and
- an amplifier for receiving an RF input signal and said drive signal produced by said power control circuit, said amplifier being operable to amplify said RF input signal using said drive signal to produce an RF output signal,
- wherein said power control circuit includes a first converter for performing gross adjustment of a signal level of said power supply signal; and a second converter for receiving an output signal from said first converter and for performing fine adjustment of a signal level of said output signal of said first converter.

14. The wireless communications device according to claim 13, wherein said amplifier is a non-linear amplifier or a switch-mode non-linear amplifier.

15. The wireless communications device according to claim 13, wherein said first converter includes a switch-mode converter, and said second converter includes a linear regulator.

16. The wireless communications device according to claim 13, wherein said power control circuit provides for adjustment of said output level of said RF output signal without utilizing any feedback of an RF output signal.

* * * * *